(12) United States Patent
Myerson et al.

(10) Patent No.: US 7,329,592 B2
(45) Date of Patent: Feb. 12, 2008

(54) METHOD FOR SCREENING CRYSTALLIZATION CONDITIONS USING MULTIFUNCTIONAL SUBSTRATES

(75) Inventors: Allan S. Myerson, Chicago, IL (US); Alfred Y. Lee, Chicago, IL (US)

(73) Assignee: Illinois Institute of Technology, Chicago, IL (US)

( * ) Notice: Subject to any disclaimer, the term of this patent is extended or adjusted under 35 U.S.C. 154(b) by 113 days.

(21) Appl. No.: 11/368,006

(22) Filed: Mar. 3, 2006

(65) Prior Publication Data

US 2006/0213425 A1    Sep. 28, 2006

Related U.S. Application Data

(63) Continuation of application No. 10/985,307, filed on Nov. 10, 2004.

(51) Int. Cl.
*H01L 21/368* (2006.01)
*C30B 7/02* (2006.01)

(52) U.S. Cl. .......................... 438/497; 117/70
(58) Field of Classification Search ................. 117/73, 117/937, 68, 70; 438/497
See application file for complete search history.

(56) References Cited

U.S. PATENT DOCUMENTS

| | | | | |
|---|---|---|---|---|
| 3,746,908 A | * | 7/1973 | Engeler | 315/10 |
| 5,130,103 A | * | 7/1992 | Yamagata et al. | 428/209 |
| 5,403,772 A | * | 4/1995 | Zhang et al. | 438/166 |
| 5,635,420 A | * | 6/1997 | Nishioka | 438/3 |
| 5,846,320 A | * | 12/1998 | Matsuyama et al. | 117/90 |
| 5,854,096 A | * | 12/1998 | Ohtani et al. | 438/166 |
| 6,605,535 B1 | * | 8/2003 | Lee et al. | 438/684 |
| 6,645,293 B2 | | 11/2003 | Myerson | |
| 7,115,900 B2 | * | 10/2006 | Aizenberg et al. | 257/40 |
| 2006/0096523 A1 | * | 5/2006 | Myerson et al. | 117/68 |
| 2006/0213425 A1 | * | 9/2006 | Myerson et al. | 117/68 |

FOREIGN PATENT DOCUMENTS

KR    2005118565 A * 12/2005

OTHER PUBLICATIONS

Myerson, et al., Crystallization on Confined Engineered Surfaces: A Method to Control Crystal Size Generate Different Polymorphs, Journal of the American Chemical Society, 2005, 127, 14982-3.
Lee, et al., Factors Affecting the Polymorphic Outcome of Glycine Crystals Contrained on Pattern Substrates, Chemical Engineering & Technology, 2006, 29(2), 281-285.

* cited by examiner

*Primary Examiner*—M. Wilczewski
(74) *Attorney, Agent, or Firm*—Laurence P. Colton; Smith, Gambrell & Russell

(57) ABSTRACT

A method for producing crystals and for screening crystallization conditions of chemical materials on distinct metallic islands with specific functional groups by using multifunctional substrates comprising a plurality of self-assembled monolayers having at least two different functionalities, for preparing and screening conditions necessary to promote specific polymorphs of a crystal, and a means for testing and screening the more precise conditions suitable for achieving desired sizes or forms of a crystal.

27 Claims, 9 Drawing Sheets

METHOD FOR SCREENING CRYSTALLIZATION CONDITIONS USING MULTIFUNCTIONAL SUBSTRATES

STATEMENT OF RELATED APPLICATIONS

This application is a continuation-in-part application based on and claiming priority on U.S. patent application Ser. No. 10/985,307 having a filing date of Nov. 10, 2004, which is currently pending and is incorporated herein by reference.

BACKGROUND OF THE INVENTION

1. Technical Field

This invention relates generally to a method for producing crystals of a desired size and form and a process for screening crystallization conditions. More particularly, this invention relates to a method for producing crystals and a process for screening crystallization conditions, such as the conditions for the production of crystals in metastable states, using a multi-functional substrate.

2. Prior Art

Specific conditions are necessary to crystallize chemical materials with a specific polymorph crystal form and size. Such conditions include the pH, temperature, ionic strength, and specific concentrations of salts, organic additives, detergents, and impurities in the solution. As different condition may allow the generation of different forms and sizes of the crystals, it is often difficult to achieve or obtain the specific condition for crystallizing a crystal with a specific form and size. As such, it is often useful to screen and test conditions that may potentially be suitable for crystal growth.

Crystallization from solution is an important separation and purification process in the chemical process industries. It is a primary method for the production of a wide variety of materials ranging from inorganic compounds to high value-added materials. In addition to product purity, crystallization must also produce particles of the desired size and shape, as well as particles of the desired polymorph.

Chemical species have the ability to crystallize into more than one distinct structure. This ability is called polymorphism (or, if the species is an element, allotropism). Different polymorphs of the same material can display significant changes in their properties, as well as in their structures. These properties include density, shape, vapor pressure, solubility, dissolution rate, bioavailability, and electrical conductivity. Polymorphism is quite common among the elements and also in inorganic and organic species. It is especially prevalent in organic molecular crystals, which often possess multiple polymorphs. The incidence of polymorphism in organic molecular crystals bears great significance to the pharmaceutical, dye, agricultural, chemical, and explosives industries.

Under a given set of conditions, one polymorph exists as the thermodynamically stable form. This is not to say, however, that the other polymorphs cannot exist or form in these conditions. It means only that one polymorph is stable while the other polymorphs can transform to the stable form. For example, acetaminophen can exist in two forms. The thermodynamically stable phase has a monoclinic form of space group P21/n. A second, less stable phase can be obtained; this phase is orthorhombic (space group Pbca) and has a higher density indicative of a closer packing of the molecules.

Often, particularly in solution systems, the polymorph in the metastable state (a β-polymorph, for example) will convert to the polymorph in the stable state (an α-polymorph, for example). However, the β-polymorph may have the more interesting, or at least other interesting, properties. In pharmaceutical product development, the most stable polymorph generally has been selected for employment in the final dosage product. Yet metastable forms have often been utilized due to their enhanced dissolution and/or bioavailability. In these cases, an understanding of the stability of these metastable forms under processing and storage conditions has proven crucial for the safety and efficacy of the drug. The United States Food and Drug Administration (USFDA) regulates both the drug substance and the polymorph for all crystalline pharmaceuticals and requires extensive studies of polymorph stability.

To develop the optimal delivery method for a particular drug in the pharmaceutical industry, there exist two very important factors. These include the control of particle (crystal) size and shape and the production of the correct polymorph. In recent years, an increased interest in new drug delivery systems has developed, turning attention to direct injection (intravenous) methods and inhalation. These methods necessitate precise control of particle size, shape, and polymorph produced. Direct inhalation requires particles in the 1-3 micron range while direct injection requires particles in the 100-500 nanometer range.

Many different techniques are employed for particle size reduction, such as supercritical fluid crystallization, impinging jet crystallization, milling, and spray drying. However, each technique has its drawbacks. For instance, milling requires heat and, as a result, the solid may thermally degrade. Spray drying, supercritical fluid based crystallization, and other crystallization-based methods are contingent on the creation of a very high supersaturation, thus favoring particle nucleation over growth. While effective in making small particles, high supersaturation often results in amorphous materials or an undesired polymorph, rather than the desired form of the crystalline compound. This is particularly true in the case of organic molecular crystals, in which the forces holding the molecules together in the lattice prove relatively weak.

Crystallization from solution generally begins with the nucleation of crystals followed by the growth of these nuclei to finite size. Nucleation and growth follow separate kinetic regimes with nucleation normally being favored at high driving forces (supersaturation) and growth being favored at low supersaturations. Since the ratio of the rate of nucleation to growth during a crystallization process determines the crystal size distribution obtained, this means that high supersaturations are normally employed to produce small crystals. In attempting to produce crystals in the 1-5 micron range and crystals below 1 micron, this has led to the use of methods that produce very large supersaturations such as supercritical fluid crystallization and crystallization from an impinging jet. Both of these methods suffer from significant problems. One problem is that substances that form organic molecular crystals can be difficult to nucleate under high supersaturations and often produce amorphous material instead of the desired crystals. Another problem is that these methods are difficult to control, design and scale-up and have had little commercial success.

Organic monolayer films have been used as an interface across which geometric matching and interactions, such as van der Waals forces and hydrogen bonding, can transfer order and symmetry from the monolayer surface to a growing crystal. Nucleation and growth of organic crystals, nucleation rates, polymorphic selectivity, patterning of crystal, crystal morphology, and orientation (with respect to the surface) can undergo modification through site-directed nucleation. This can be achieved using supramolecular assemblies of organic molecules, such as chemically and spatially specific surfaces. Compressed at the plane of water/air interface, Langmuir monolayers are mobilized by, and commensurate with, the adsorption of aggregates during crystallization.

Self-assembled monolayers (SAMs) are single layers of ordered molecules adsorbed on a substrate due to bonding between the surface and molecular head group. SAMs are molecular units that are spontaneously formed upon certain substrates, such as gold and silicon, when immersed in an organic solvent. One of the better known methods to form SAMs is when alkanethiol molecules chemisorb on gold surfaces through the thiol head group to reproducibly form densely packed, robust, often crystalline monolayer films. The surface chemical and physical properties of the monolayer films can be controlled precisely by varying the terminal chemical functionality of the alkanethiol molecule.

SAMs and mixed SAMs lack the mobility of molecules at an air-water interface and, hence, lack the ability to adjust lateral positions to match a face of a nucleating crystal. This is especially true for SAMs of rigid thiols, for which even conformational adjustment is not possible. SAMs of 4-mercaptobiphenyls are superior to those of alkanethiolates in providing stable model surfaces, as well as in the ability to engineer surface dipole moments. Coupled with the ability to engineer surface functionalities at the molecular level, SAMs and mixed SAMs of rigid thiol offer unique surfaces for nucleation and growth of inorganic and organic crystals.

Silane SAMs have been used to promote heterogeneous nucleation and growth of iron hydroxide crystals and to study the effect of surface chemistry on calcite nucleation, attachment, and growth. For example, $CaCO_3$ has been crystallized on surfaces of alkanethiolate SAMs on gold and SAMs of functionalized alkanethiols can control the oriented growth of calcite. Also, the heterogeneous nucleation and growth of malonic acid ($HOOCCH_2COOH$) has occurred on surfaces of alkanethiolate SAMs on gold that terminated with carboxylic acid and with methyl groups. However, while SAMs have been used to grow crystals, specifically patterned SAMs have not been used to limit the dimensions and sizes of crystals, or to grow distinct crystal of selected dimensions and sizes.

U.S. Pat. No. 6,645,293 to Allan S. Myerson discloses methods for the crystallization of nano-size crystals of molecular organic compounds while operating at a low supersaturation. The methods are based on controlling the domain size available during the crystallization process. In one method, microcontacted printed SAMs with local domain area sizes ranging from 25 $\mu m^2$ to 2500 $\mu m^2$ and fabricated SAMs generated from electron beam lithography, are employed to control the size, orientation, phase, and morphology of the crystal. In another method, a continuous micro-crystallizer having a vessel diameter of 25 microns or less is used to ensure that that the maximum size of the crystals in two dimensions is constrained by the vessel itself. Both methods allow control of supersaturation and growth conditions, as well as manageability over crystallinity and polymorphism, and each method's domain size has the potential for further reduction.

Although there are methods for initiating crystallization (including nucleation rates) and growing crystals (including affecting the polymorphic selectivity, patterning of crystal, crystal morphology, and orientation of the crystals), there is a need for screening and characterizing the crystals produced, for further research on the crystals, and for producing crystals of a desired morphology, polymorphic form and stability, among other characteristics. Therefore, it can be seen that there is a need for a method for producing crystals of both a desired structure and a desired size under modest supersaturation conditions in conjunction with a method for screening the crystals for characteristics such as morphology, polymorphic form and stability.

BRIEF SUMMARY OF THE INVENTION

Briefly, this invention is a method for preparing crystals on distinct metallic islands with specific functional groups and then using the metallic islands to screen the crystallization conditions. This invention also may be used to prepare and screen the conditions necessary to promote specific polymorphs of a crystal. Additionally, as the crystal formation proceeds on the defined metallic islands, it is possible to achieve high throughput and controlled crystal formation due to, for example, the pre-selected size or sizes of the metallic islands. While the general conditions required to grow many crystals are known, this invention also provides a means to test and screen the more precise conditions suitable for achieving a desired size or form of a crystal.

In a preferred embodiment, this invention takes advantage of the surface chemistry of self-assembled monolayers (SAMs) to improve crystal formation. More particularly, SAMs are deposited on patterned substrates having metallic islands exhibiting lyphophilic (or hydrophilic) properties and are surrounded by a lyophobic (or hydrophobic) region. Lyophilic (or hydrophilic) SAMs can be designed by employing thiol surfactants. By depositing SAMs on the substrate, it is possible to create functionalized metallic islands and ensure that crystal formation occurs on the metallic islands.

More particularly, nucleation and growth of the crystals can occur exclusively on the functionalized metallic islands. Solution droplets having a defined size and shape are formed on the metallic islands when the patterned surface of the metallic island is immersed and slowly withdrawn from an unsaturated, saturated or supersaturated solution. Preferably, the SAMs and functional group are selected to create a preferential bond between the metallic island and the solution droplets, and the solution droplets become supersaturated solutions, which is more optimal for crystal growth. Supersaturation can be accomplished by any of the known methods, such as evaporation, antisolvent addition, vapor diffusion, heating and cooling, and the like.

The preparation of crystal samples is accomplished in a micro-scale, high throughput manner. More particularly, this method for preparing crystals comprises the steps of:

(1) preparing a multi-functional substrate with individual metallic islands having SAMs of different functionality as a result of having different but desired chemical functional head groups; and (2) preparing a crystal from solution droplets placed on the metallic islands on the substrate, wherein the metallic islands preferably are prepared so that the solution droplets preferentially wet the metallic islands.

One illustrative method for preparing a multi-functional substrate comprises the steps of:

(1) depositing a metal layer onto a surface of a substrate so to create metallic islands of the deposited metal;

(2) depositing a first layer of SAMs with a first chemical functional head group onto a first portion of the metallic islands;

(3) depositing a second layer of SAMs with a second different chemical functional head group onto a second portion of the metallic islands; and (4) repeating step (3) with additional layers of SAMs with additional and different chemical functional head groups onto additional portions of the metallic islands.

Another illustrative method for preparing a multi-functional substrate comprises the steps of:

(1) depositing a metal layer onto a surface of a substrate so to create metallic islands of the deposited metal; and (2) depositing at least two distinct SAMs (e.g. having distinct desired chemical functional head groups) onto at least two distinct metallic islands so to create a pattern of metallic islands that can then differ with respect to the SAM functionality thereupon, as in steps (2)-(4) in the method disclosed immediately above.

The metal layer may be deposited onto a substrate (such as glass or a silicon wafer) using a metal evaporation process. Generally, a metal adlayer such as titanium or chromium is first deposited onto the substrate to promote adhesion between the metal layer and substrate. Metals suitable for use as the metal layer include gold, silver, titanium, platinum, nickel, copper, palladium and combinations thereof. Preferably, the metal layer is gold and the adlayer is titanium, both of which are deposited onto the substrate using an electron beam evaporator. Such methods for depositing the metal layer onto the substrate may incorporate the use of a mesh or a photoresist polymer.

Metallic islands can be formed in the metallic layer by different techniques such as etching or masking. In etching, portions of the metallic layer are removed by known techniques, such as acid etching and light etching, leaving discrete metal islands. In masking, a mesh or other mask is placed over the substrate prior to depositing the metal layer such that the metal layer deposits on the substrate only in those areas left open by the mesh or mask openings.

Once the metallic islands have been created on the substrate, a multiple SAMs layer pattern can deposited on the substrate by subsequent immersions in surfactant materials or by otherwise contacting the surfactant materials to the substrate. For example, the substrate can be first immersed into the first surfactant material so to create a SAM with a specific chemical functional head group formed on the metallic islands. Subsequently, the substrate is soaked in a second surfactant material so to provide back fill-in for the metallic islands, with the second surfactant wetting the area of the substrate not covered by the metallic islands. Alternatively, the first surfactant (or a variety of surfactants when creating a multi-functional substrate) may be deposited on select metallic islands and additional surfactant may be deposited on other metallic islands so to create a variety of crystallization conditions. In this manner, different types of crystals can be grown on metallic islands coated with SAMs of different functionalities, with no crystals being grown in the areas between metallic islands.

A crystal is prepared on the metallic island from a solution droplet under a set of defined parameters. As the parameters influence the size and form of crystal formation, it is possible to determine the condition for growing a crystal of a desired size and form by testing various parameters. For example, the size of the metallic island, the structure of the metallic island, and the solution concentration all can affect the size of the resultant crystal. That is, the conditions for crystallization may be selected to promote a specific form or size (or range of sizes) of crystal. While the crystal size is in part controlled by the size of the droplet and the size of the metallic island, the crystal form may be controlled by varying the rate of evaporation (or other supersaturation technique such as antisolvent addition, vapor diffusion, heating and cooling, and the like), the incubation temperature, the concentration of droplet solution, and the chemical functionality of the SAMs. By modifying the characteristics of the droplet, it is possible to obtain crystals of a desired form and size.

One illustrative method for depositing solution droplets upon the metallic islands is by immersion of the substrate into a crystallite solution. Specifically, droplets of the crystallite solution are placed on the metallic islands of the substrate by immersing and soaking the substrate in the crystallite solution. Subsequently, the substrate is slowly withdrawn from the solution such that the solution droplets wet the metallic islands. Solution droplets with defined sizes and shapes are formed on the metallic islands when the patterned surface is immersed and slowly withdrawn from the solution. Preferably, the droplet solution contains both seeds (crystallized material) and solvent so to improve crystallization rates. The droplets formed on the metallic islands will eventually crystallize. More specifically, the solution droplets will act or react differently depending on the SAMs they are on. SAMs of one functionality can cause crystals of one type (morphology or phase) to form, while SAMs of another functionality can cause crystals of another type to form. Thus, having a multi-functional substrate has the advantage of allowing different crystal forms to grow on a single substrate.

After the crystals have formed on the metallic islands, the crystals now may be analyzed with or without the removal of the crystals from the substrate, which greatly simplifies the screening of the crystals. The size, morphology, and crystal form may be identified or analyzed by optical, electron, and Raman microscopy. Other analytic techniques such as single crystal and powder x-ray diffraction, particle analyzers, and thermal analysis may be used to identify the crystalline forms on the metallic islands as well. The ability to screen the crystals in this manner greatly increases the efficiency of the screening process in that depending on the metallic island size, hundreds to tens of thousands or more metallic islands can be contained in a relatively small area and thus hundreds to tens of thousands or more crystals can be produced in this relatively small area.

In use and application, this invention provides a means to test and screen crystallization conditions for crystals with desired sizes and forms. The use of the patterned metallic islands provide a quick, reliable, consistent method to provide picoliter volume or smaller solution droplets for the generation of supersaturated solutions, eventually resulting in the patterned crystallization of the solute with controlled size and form. As such, this invention provides a method to prepare crystals and screen crystallization conditions in a high-throughput manner.

These features, and other features and advantages of the present invention, will become more apparent to those of ordinary skill in the relevant art when the following detailed description of the preferred embodiments is read in conjunction with the appended drawings in which like reference numerals represent like components throughout the several views.

DETAILED DESCRIPTION OF THE PREFERRED EMBODIMENTS

Figure 1:
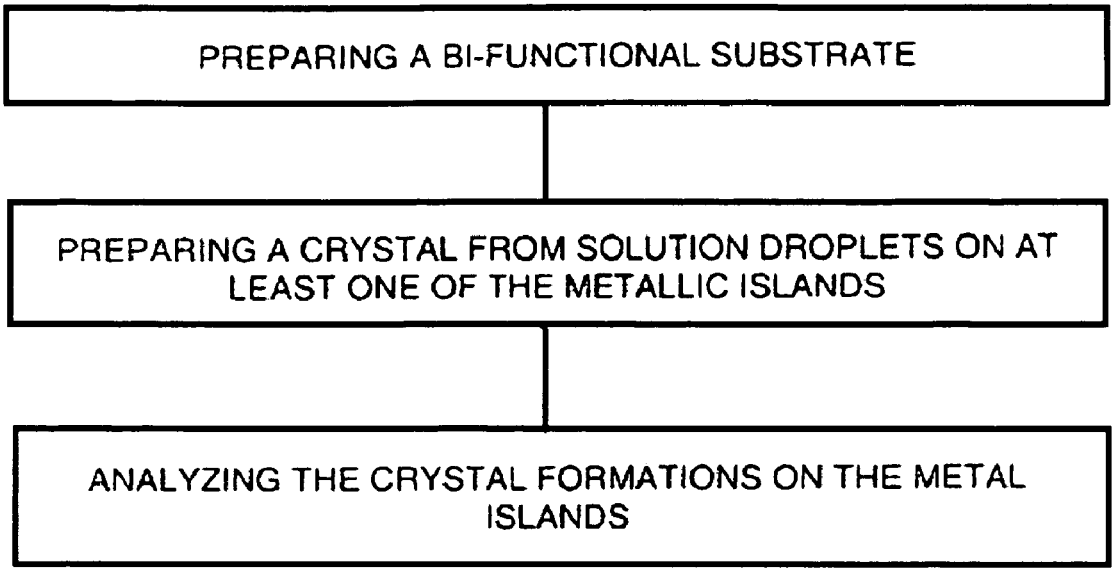
FIG. 1 is flow chart depicting one illustrative embodiment of the present invention.

Preferred embodiments of the present invention are methods for preparing crystals and screening crystallization conditions of chemical materials on distinct metallic islands. Preferably, such embodiments may be used to prepare and screen the conditions necessary to promote specific polymorphs of a crystal of a specific size. As the crystal formation can occur on the distinct metallic islands, and a large number of the distinct metallic islands can be contained in a relatively small area, it is possible to achieve high throughput conditions and controlled crystal formation. Additionally, by using SAMs of different functionalities on the same substrate, both different polymorphs of a crystal and different sized crystals of different polymorphs can be grown on a single multi-functional substrate. While this invention is described herein in conjunction with the preferred embodiments, it will be understood that the invention is not limited to these embodiments.

While the general conditions required to grow many crystals are known, this invention provides a means to test and screen the more precise conditions suitable for achieving a desired size or form of a crystal. More particularly, an embodiment provides a means to test and screen particular conditions for achieving a desired size or form of a crystal. For example, this embodiment may be used to test and screen the conditions to crystallize specific polymorphs, which exhibit different chemical and physical properties (e.g. solubility, dissolution and bioavailability), for use in the pharmaceutical field.

This method enables the solutions to crystallize under a variety of conditions in a quick and reliable manner so as to capture the diversity of the crystals. The substrate comprises at least two distinct self-assembled monolayers (SAMs) on which crystals can grow and can be utilized to screen for polymorphs of inorganic and organic compounds. In one embodiment, the substrate comprises metallic islands having distinct SAMs and dimensions so as to provide more diverse crystallization conditions. This invention may take advantage of the surface chemistry of SAMs to improve crystal formation. Further, a multi-functionalized substrate using SAMs attached to metallic islands can provide a library of different SAMs for use in screening solid states and polymorphs and in determining the conditions for promoting crystal nucleation and growth. It is known that SAMs can control polymorph selectivity and in many cases such selectively can be attributed to the interfacial hydrogen bonding between the molecular clusters and organic monolayer film. Also, lattice matching between a particular crystal face of a polymorph and the monolayer surface can direct nucleation and crystal growth of this solid phase.

More particularly, SAMs are deposited on patterned substrates having metallic islands exhibiting lyphophilic (or hydrophilic) properties and are surrounded by a lyophobic (or hydrophobic) region. Lyophilic (or hydrophilic) SAMs can be designed by employing thiol surfactants where the chemical functional head group includes, for example, carboxy (—COOH), hydroxyl (—OH), nitro (—$NO_2$), sulfonic acid (—$SO_3^-$), and phosphonic acid (—$PO_4^-$) functional groups. By depositing SAMs on the substrate, it is possible to create functionalized metallic islands and ensure that crystal formation occurs on the metallic islands. As disclosed in more detail below, a large number of SAMs can be deposited in a relatively small area and the size of the SAMs can be varied so as to be able to provide a significant number of sites for crystal formation and growth and to allow for the crystallization and growth of various sizes and forms of crystals. Thus, nucleation and growth of the crystals can occur exclusively on the functionalized metallic islands having a variation of size and/or shape. Further, the metallic islands can be utilized to screen polymorphic forms of inorganic and organic materials and can be used to enhance the nucleation and growth of molecules that might be difficult to crystallize with conventional methods or techniques.

Solution droplets having a defined size and shape and can be formed on the metallic islands by, for example, immersing and slowly withdrawing the substrate from an unsaturated, saturated or supersaturated solution. Alternatively, the solution may be pipetted onto the metallic islands. Preferably, the SAMs and functional groups are selected to create a preferential bond between the metallic islands and the solution droplets. The solution droplet becomes a more saturated solution by removal of solvent, which is more optimal for crystal growth. Specifically, the solution droplet remains on the surface of the metallic islands during and after supersaturation.

In one embodiment, the different solid state or polymorph forms of a selected substance can be screened using the variations in crystallization conditions. For example, the rate of solvent evaporation on the metallic islands can vary with the different sized metallic islands. More particularly, the volume of the solution droplet can be controlled by the dimensions of the metallic islands and crystallization can occur as the solvent evaporates from the droplets. Crystallization is confined to the metallic islands due to the patterned surfaces, and the solution wets only the lyophilic (or hydrophilic) metallic islands, which are surrounded by a lyophobic (or hydrophobic) region. Solid state form diversity or polymorph diversity through variation of the solvent evaporation rate can be examined using metallic islands in a gradient of sizes or with various sizes.

For small size droplets, the evaporation process can be extremely fast after removal of the substrate from the solution. This can lead to high supersaturation and favor the nucleation and growth of a high energy metastable polymorph. For example, if the metastable phase is in contact with a solvent, this form can convert to a more stable crystal modification, which is known as solution-mediated phase transformation and obeys Ostwald's Law of Stages where the kinetic, high energy phase initially appears followed by its transformation to the more stable form. With small islands (or small size droplets), the metastable form can be stabilized with the small volumes as there is not enough solution for it to be mediated to a less energetic solid phase.

Further, the different solid state or polymorph forms of a selected substance can be screened using the various SAMs on the metallic islands. This invention also comprises a new method for making distinct metallic islands for the nucleation and growth of crystals for screening purposes. As the SAMs or the functional groups on the SAMs may control crystal formation, it is possible to screen crystallization conditions based on the SAMs on a specific metallic island. Generally, the crystals are grown on the distinct metallic islands and then screened in situ to characterize the crystals as to form, and specifically polymorphic form.

Droplets of solution containing the materials or compounds of interest are placed on the distinct metallic islands via various methods, such as the immersion method mentioned previously and disclosed in more detail below. The solution achieves supersaturation (low, modest or high, depending on the specific circumstances) via known techniques, such as, for illustrative purposes only, evaporation, vapor diffusion, antisolvent diffusion, oil diffusion, and heating and cooling techniques. The crystallization and supersaturation conditions are controlled, which allows the control of the crystal forms. Once the crystals are formed, the crystals can be characterized or otherwise screened by known techniques, such as Raman microscopy. Effectively, the present invention is a highly efficient method of screening crystals using the small distinct metallic islands.

Further, in terms of polymorph screening, the bulk solution from which the solution droplets emanate may contain various forms of a crystal, such as a stable α-polymorph and a metastable β-polymorph. Metastable forms have a tendency to change quickly to the more stable form. Thus, in prior crystallization techniques, the resulting crystals formed from the solution phase tended to be of the more stable polymorph. In the present invention, the crystals are not grown directly in the liquid phase, but are grown on a solid, namely, the distinct metallic islands. As a result, crystals of the metastable polymorph can grow on the distinct metallic islands, resulting in the production of more and better metastable (or other) polymorphs. The growth of the crystals on the solid metallic islands helps to prevent the conversion of the metastable crystals to the more stable crystals as solid state conversion is less likely to occur than liquid state conversion.

SAMs Techniques

An illustrative example of a crystallization domain of controlled size and geometry is a SAM with local domain area sizes selected to result in a crystal having the desired dimensions. In SAM techniques, the crystallization domain comprises microcontacted printed SAMs with local domain area sizes as small as 15 μm$^2$ and fabricated SAMs generated from electron beam (e-beam) lithography. These SAMs are employed to control the size, orientation, phase, and morphology of the crystal. Functionalized SAMs can serve as heterogeneous nucleants and promote the nucleation of organic, inorganic, and protein crystals.

Patterning using SAMs is known and has attracted growing attention due to its potential applications in sensor design, microelectronic devices, in addition to many other uses. To date, structures of various SAMs on gold, with a characteristic scale of 0.1-100 μm, have been generated using microcontact printing, micromachining, focused ion beam writing, photolithography/lift off, and microwriting. Of these techniques, the most versatile is microcontact printing. Many of these SAM techniques can be found in U.S. Pat. No. 6,645,293 and in other publicly available literature and is known to those of ordinary skill in the art.

In the present invention it has been found that the distinct metallic islands created using SAMs techniques can be varied in size. Islands having a square configuration tend to be the preferred shape as such configurations are relatively simple to construct on a substrate and rectangular arrays of samples, such as the array of a number of square islands, are a norm for characterization equipment. The preferred islands have sides in the sub-1000 micron range, with the size of the islands being selected to balance the desired crystal size with the desired numbers of crystals or crystal characterization throughput. Specifically, smaller crystals can be grown on smaller islands while larger crystals can be grown on larger islands, and smaller islands allow for a higher island density (more islands per substrate area) while larger islands allow for a lower island density (fewer islands per substrate area). As disclosed in more detail below, 200 islands having a side of 725 microns can be contained on the same are as 80,000 islands having a side of 30 microns. Similarly, 200-290 micron crystals can be grown on 725 micron islands while 5-10 micron crystals can be grown on 30 micron islands. Further the islands can be arranged in a gradient of sizes so to provide for systematic testing of crystallization conditions.

(1A) Crystal Production Method—Preparing a Bifunctional Substrate

Referring now to FIGS. 1-4, an embodiment of this invention is a method for the preparation of crystal samples in a micron-scale, high throughput manner on a bifunctional substrate. This method for preparing crystals comprises the steps of:

(1) preparing a bifunctional substrate with metallic islands and multiple layers of SAMs having desired chemical functional groups; and (2) preparing a crystal from solution droplets on the metallic islands on the substrate.

Figure 2A:
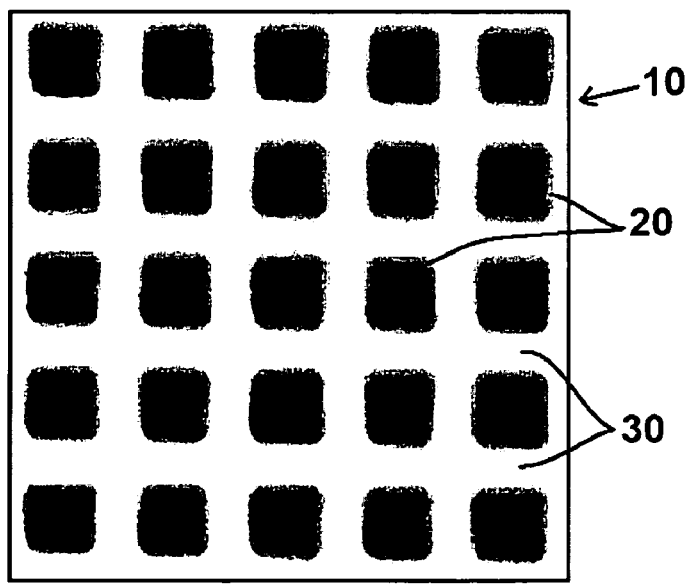
FIG. 2A is a photomicrograph of a substrate showing patterned metallic islands with uniform size.
Figure 2B:
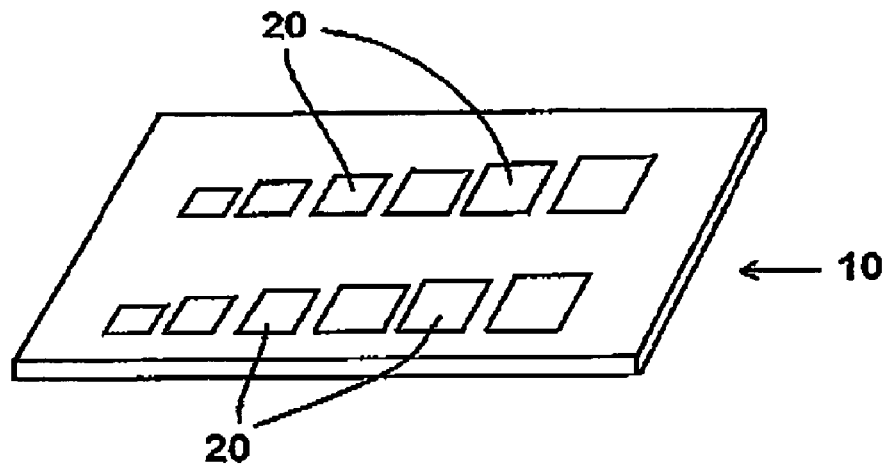
FIG. 2B is a drawing of a substrate showing patterned metallic islands with a variety of sizes.

The substrate 10, as shown in FIGS. 2A and 2B, can be prepared using SAMs techniques so that it has bifunctional metallic islands 20. FIG. 2A illustrates metallic islands 20 of the same size on a single substrate 10, while FIG. 2B illustrates metallic islands 20 of different sizes on a single substrate 10. The substrate 10 (such as a glass slide or a silicon wafer) is prepared either so that the metallic islands 20 are lyophophilic and the backfill 30 is lyophobic or so that the metallic islands 20 are hydrophilic and the backfill 30 is hydrophobic. The metallic islands 20 provide the location where crystals ultimately can be grown and the differences in material of the backfill 30 and the metallic islands 20 help to ensure that the crystal grows on the metallic island 20.

One method for preparing a bifunctional substrate comprises the steps of:

(1) depositing a metal layer onto a surface of a substrate so to create metallic islands of the deposited metal;

(2) depositing a first layer of SAMs having desired chemical head group onto the metallic islands; and (3) depositing a second layer of SAMs having another chemical functional group on the substrate that acts as a backfill for with respect to the metallic islands.

Figure 3:
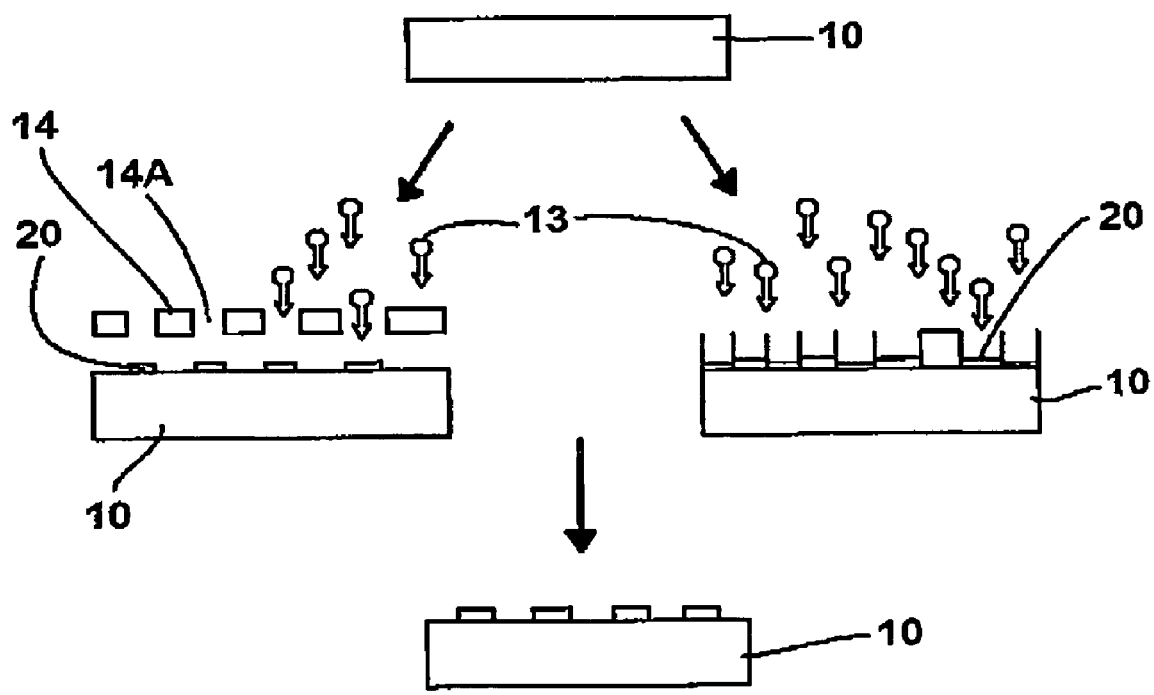
FIG. 3 is a schematic illustrating methods for forming of patterned metallic islands on a substrate.

Referring to FIG. 3, a metal layer 13 may be deposited first onto a substrate 10 using a metal evaporation process. Such evaporation processes are able to deposit the metal onto the substrate 10 and a metal adlayer is usually employed to promote adhesion between the substrate 10 and any future metal layers. Metals suitable for use as the preferred metal layer 13 include gold, silver, palladium, copper, platinum, nickel, and combinations thereof, while metals suitable for the preferred metal adlayer include titanium and chromium. Preferably, the metal layer 13 is gold and the adlayer is titanium, which may be deposited onto the substrate using an electron beam evaporator. Such methods for depositing the metal layer 13 onto the substrate 10 may incorporate the use of a mesh 14 or a photoresist 16 polymer and are known or readily determinable by those with ordinary skill in the art without undue experimentation.

In the illustrative example shown in FIG. 3, depositing the metal layer 13 on the substrate 10 may be accomplished using a mesh 14 or liftoff photoresist. Using this mesh or liftoff photoresist method, the metal layer 13 is applied across mesh 14 or photoresist so to create a distinct and defined pattern of metallic islands 20. As the metal is deposited on the substrate 10 only through the open sections 14A of the mesh 14 or liftoff photoresist, the size and shape of the pattern of the metallic islands 20 are determined by the open sections 14A and pattern of the mesh 14 or photoresist. After the mesh 14 or photoresist has been removed from the substrate 10, a pattern of metallic islands 20 is revealed on the substrate 10. Preferably, the mesh 14 or photoresist has open sections ranging from 3 microns to 1000 microns and has a relatively uniform pattern. The size and shape of the metal islands 20 may be controlled by controlling the pattern of the mesh 14 or photoresist.

Figure 4:
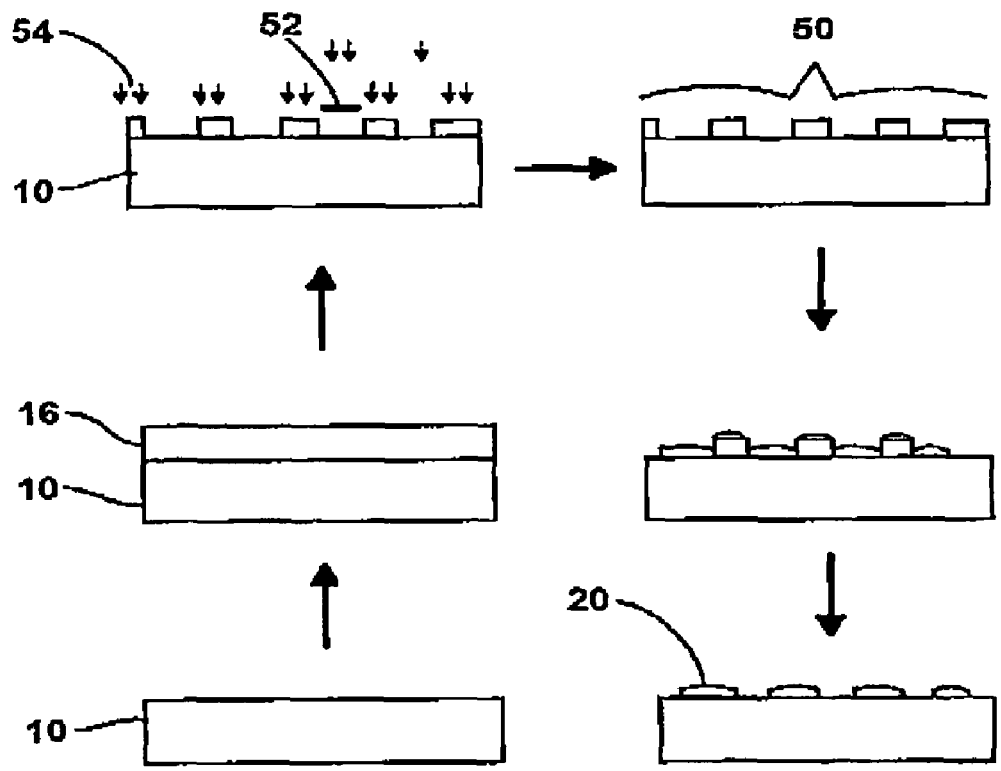
FIG. 4 is a schematic illustration of a method to fabricate a substrate containing metallic islands of varying sizes.

Alternatively, referring to FIG. 4, the metallic islands 20 may be fabricated by using photolithographic techniques. A photoresist pattern 50 can be formed on the substrate 10 with the dimensions of the islands 20 controlled by a photomask 52. Using this method, the substrate 10 is spincoated with a photoresist polymer 16 (a material that hardens when exposed to light). The photomask 52, with a pattern of islands, can be applied to the photoresist polymer 16 to create islands 20. The substrate 10 then can be exposed to a light source 54 to create a pattern of islands on the substrate 10. Again, the size and shape of the metal islands 20 may be controlled by controlling the pattern of the photomask 52.

As discussed, depositing the pattern of the metal islands 20 on the substrate 10 may be accomplished using a photoresist polymer 16. As a photoresist polymer 16 becomes insoluble when exposed to ultraviolet light, a photoresist pattern such as a photomask 52 is placed over the substrate and exposed to ultraviolet light such as light source 54. After exposure to the ultraviolet light 54, and the subsequent hardening of the portions of the photoresist polymer 16 exposed to the ultraviolet light 54, the substrate 10 is developed and the unhardened portions of the photoresist polymer 16 are removed using an organic solvent such as acetone. This process leaves a pattern of hardened portions of the photoresist polymer 16 on the substrate 10. The metal for the metallic islands 20 then is evaporated onto the substrate 10, and the metal adheres to the substrate 10 in the spaces 56 between the hardened photoresist polymer 16, forming the metallic islands 20. The photoresist pattern 52 then is lifted off of the substrate 10 leaving only the metallic islands 20. Specifically, the size and pattern of the islands 20 is dictated by the photoresist pattern 52 that is formed on the substrate 10, which in this example are varied. Again, the size and shape of the metallic islands 20 may be controlled by the photoresist pattern 52.

The SAMs include both thiol and silane based surfactant molecules. Possible surfactants include, but are not limited to, short and long chain alkanethiols, $SH(CH_2)_nX$, and aromatic thiolates, $SH(C_6H_5)_nX$, where n represents the chain lengths (or repeating units) and X represents an organic and inorganic functional tail groups which include, but not limited to, $CO_2^-$, $SO_3^-$, $PO_3^-$, $NH_3^+$, $N(CH_3)_3^+$, $NO_2$, $OH$, $CH_3$, $CF3$, $F$, $Cl$, $Br$, $I$, $CO_2CH_3$, $SH$, $C_2H_4OH$ and $SCH_3$. While the second surfactant material for creating the second SAMs to be used as the backfill 30 may have the chemical head groups similar to that the first surfactant material 22 for creating the first SAMs, preferably the chemical head group of the second surfactant material is different from that of the first surfactant material 22. Preferably, the second surfactant material is selected so that is does not form a strong bond with a solution droplet (is lyophobic or hydrophobic). One of ordinary skill in the art may select surfactant materials without undue experimentation so to optimize the bond between the SAM and the substrate 10 and to place a desired functional group on the metallic islands 20.

(1B) Crystal Production Method—Preparing a Multi-Functional Substrate

Figure 5:
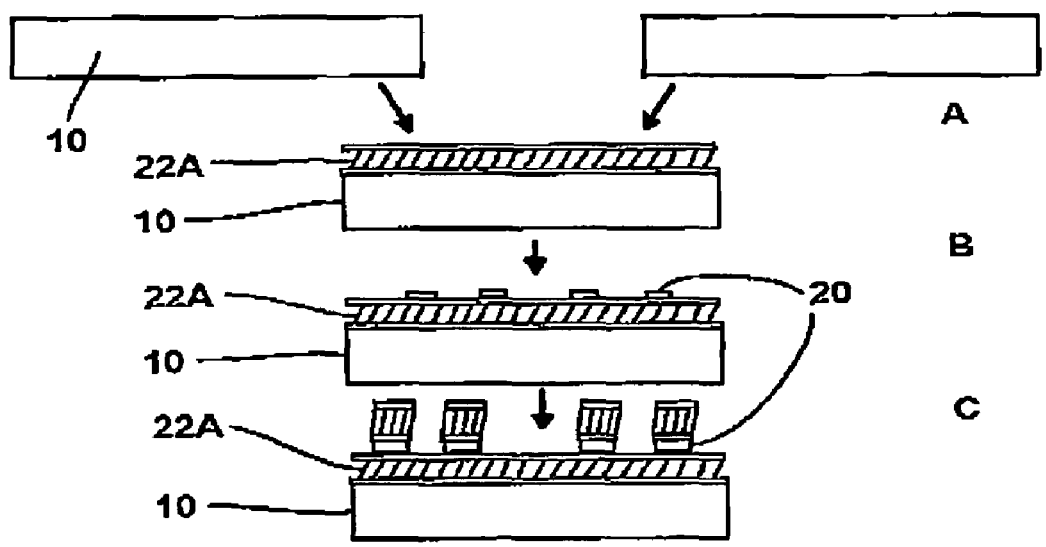
FIG. 5 is a schematic illustration of a first method to prepare multi-functionalized metallic islands on a substrate.
Figure 6:
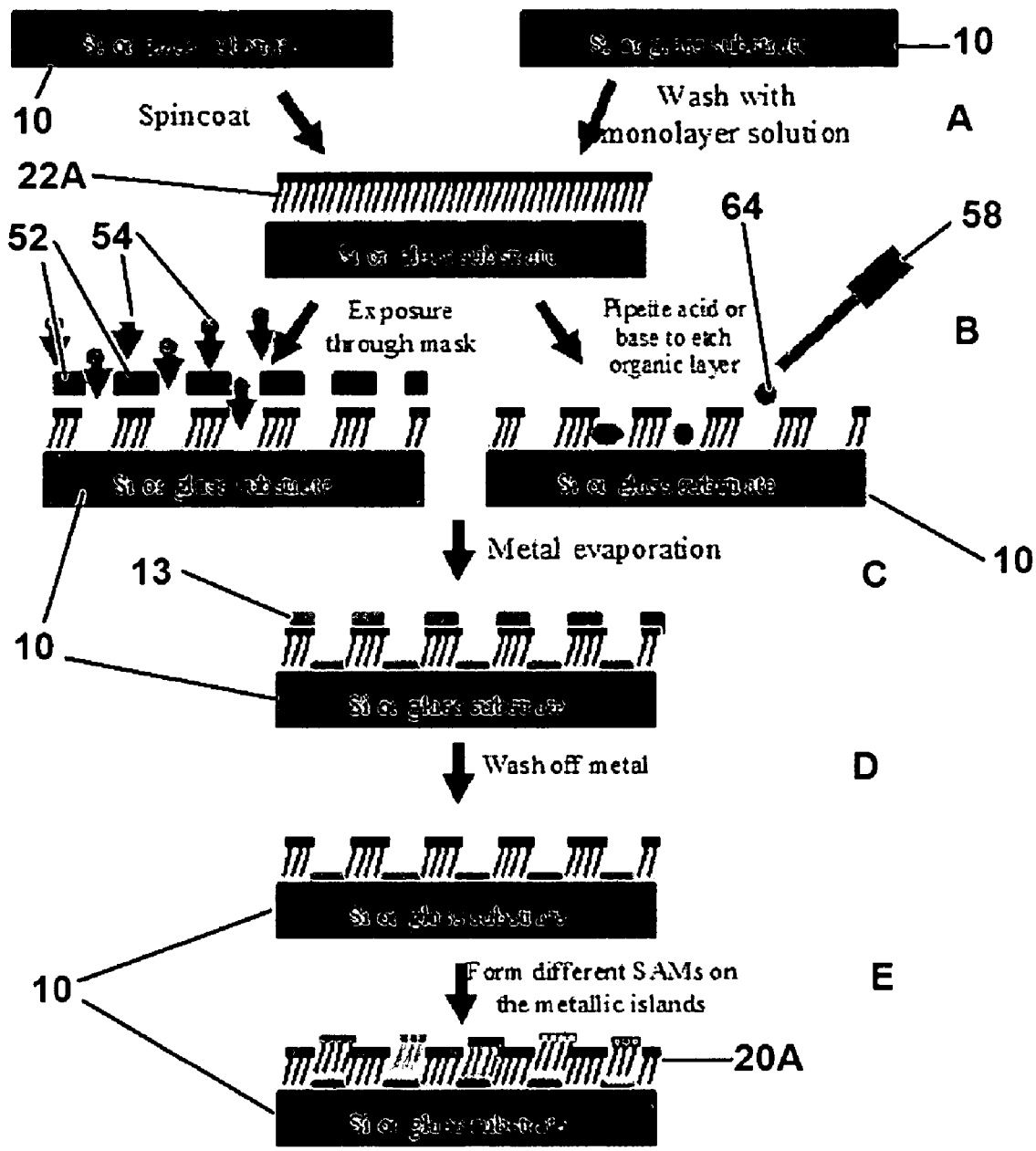
FIG. 6 is a schematic illustration of a second method to prepare multi-functionalized metallic islands on a substrate.
Figure 7:
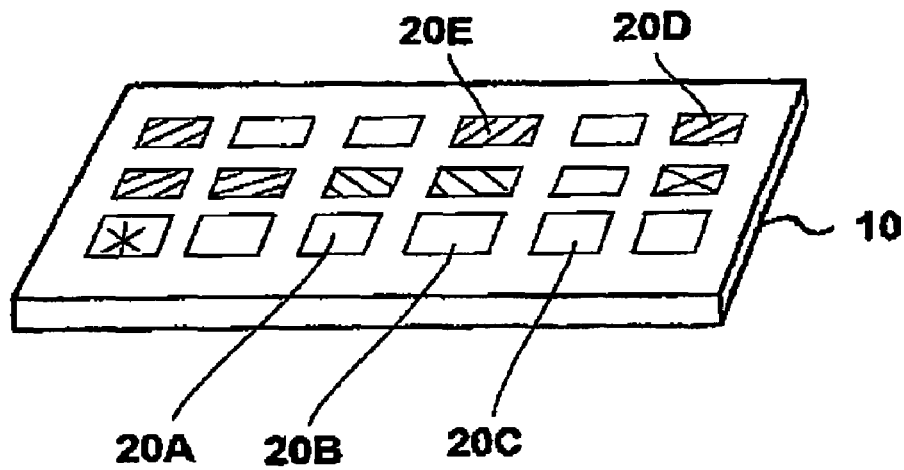
FIG. 7 is an illustration of a multi-functional self-assembled monolayers substrate involving metallic islands.

Referring now to FIGS. 5-7, an embodiment of this invention is a method for the preparation of crystal samples in a micron-scale, high throughput manner on a multi-functional substrate. This method for preparing crystals comprises the steps of:

(1) depositing a metal layer onto a surface of a substrate so to create metallic islands of the deposited metal;

(2) depositing a first layer of SAMs with a first chemical functional head group onto a first portion of the metallic islands;

(3) depositing a second layer of SAMs with a second different chemical functional head group onto a second portion of the metallic islands; and (4) repeating step (3) with additional layers of SAMs with additional and different chemical functional head groups onto additional portions of the metallic islands.

Another illustrative method for preparing a multi-functional substrate comprises the steps of:

(1) depositing a metal layer onto a surface of a substrate so to create metallic islands of the deposited metal; and (2) depositing at least two distinct SAMs (e.g. having distinct desired chemical functional head groups) onto at least two distinct metallic islands so to create a pattern of metallic islands that can then differ with respect to the SAM functionality thereupon, as in steps (2)-(4) in the method disclosed immediately above.

In this embodiment, various SAMs can be deposited mechanically via direct pipetting. The conditions for crystallization may be selected to promote a form or size of crystal. The size and volume of the droplets can be dependent on the size of the metallic islands. The solvent evaporation rate can be manipulated through variations in the island dimensions or (droplet volume). The solid state outcome, in turn, can be influenced by the different degrees of supersaturation of the droplets. This method offers a quick and reliable technique to screen polymorphs through manipulation in the rate of evaporation of solvent.

The substrate is formed by pipetting solutions of different SAM solutions onto each metallic island. Selective wetting and crystallization of organic and inorganic particles as well as macromolecules can be constrained to the metallic island where parallel crystallization experiments utilizing a library of functionalized SAMs can be carried out. The type of functional tail group and molecular structure (or geometry) of the SAMs can enhance the nucleation of one solid phase to another, and generate different polymorphs.

Two possible approaches to making multifunctional SAM substrates (or multi-SAMs). The first is shown in FIG. 5 where metallic islands 20 are evaporated onto a thin organic layer, such as monolayer film 22A, coated substrate 10. The monolayer film 22A can be generated either through washing the bare substrate 10, which preferably is glass or silicon, with a monolayer solution, preferably lyophobic or hydrophobic, or by spincoating TEFLON® resins onto the substrate 10 (step A). Afterwards, metallic islands 20 are fabricated on the organic layer coated surface, namely on the monolayer film 22A (step B). Since this monolayer film 22A is lyophobic, a drop of monolayer solution on each island 20 will not spread to its adjacent islands 20 as the monolayer solution is pinned to the island 20. Thus, different monolayer solutions can be pipetted or otherwise applied to the metallic islands 20, generating a multi-SAMs substrate 10 (step C). Further, the multi-SAM 10 not only can contain SAMs with different functional groups (or tail groups), the multi-SAMs 10 also can have different molecular backbones which will lead to SAMs of different structure and geometry.

A possible drawback with this approach is that the evaporated metallic island 20 on top of the organic film, monolayer film 22A, might not interact (or stick) with the coated substrate 10 and consequently, the metallic islands 20 can be removed by washing. To address this issue, a second approach is shown in FIG. 6. After a lyphobic (or hydrophobic) thin film layer 22A is formed on the substrate 10 either by spincoating or washing (step A), parts of the thin film layer 22A are etched out, preferably either by ultraviolet light 54 exposure through a mask 52 or just by mechanically pipetting 58 drops 64 of an acid or base onto the coated substrate 10 and then heating the surface to remove the organic layer (step B). In the first scenario, exposure through a mask 52, the size and shape of the etched patterned is determined by the size and shape of the holes in the mask 52. In the latter scenario, the size and shape of the drops 64 on the surface influences the design of the etched pattern. In many cases, the etched pattern will resemble non-uniform circles with varying radius. Next, a metal layer 13 is deposited on the coated substrate (step C) and due to the non-stickiness factor, metals that are evaporated on top of the remaining portions of the organic film layer 22A can be removed by simply washing (step D). Lastly, the multi-SAMs substrate 10 can be fabricated by pipetting different monolayer solutions on each island 20 (step E). Thus, in contrast to the bifunctional substrates disclosed above in which the metallic islands 20 have the same SAMs coatings, the multi-functional substrates disclosed in this section have metallic islands 20A having different SAMs coatings Thus, in the examples shown in FIGS. 5 and 6, a substrate 10 is coated with a first monolayer solution to form a continuous thin film layer 22A on the surface of the substrate 10. For example, such a first wash can be an immersion in a first surfactant solution, such as a thiol. Metallic islands 20 then are fabricated using any of the known methods or methods disclosed herein. The islands 20 then are subjected to the same or different surfactant solutions to create SAM coated islands 20A. Coated islands 20A having SAMs of different compositions can be created by pipetting the desired SAM solution directly onto the specific islands 20A.

As can be seen in FIGS. 5 and 6, the different islands 20A can have SAM coatings of different compositions.

Referring to FIG. 7, a top down view of a multi-SAMs substrate 10 is shown after being generated from the processes shown schematically in FIGS. 5 and 6. Each metallic island 20A, 20B, 20C, 20D, 20E contains a SAMs with a unique tail (functional) group and/or molecular structure. In contrast to a bifunctional substrate, there is no backfill 30 as the hydrophobic (or lyophobic) monolayer is formed first on the substrate 10. In use, the multi-SAMs substrate 10 can be immersed in a crystalline solution with the crystalline solution wetting the metallic islands 20A, 20B, 20C, 20D, 20E. With the SAMs being different on the metallic islands 20A, 20B, 20C, 20D, 20E, different types of crystals can form on the different metallic islands 20A, 20B, 20C, 20D, 20E. For example, with glycine, α-glycine crystals may form on one type of metallic island 20A while β-glycine crystals may form on another type of metallic island 20B. Similarly, with mefenamic acid, mefenamic acid Form I may form on one type of metallic island 20C while mefenamic acid Form II crystals may form on another type of metallic island 20D.

The size of the metallic islands 20 and the density of the metallic islands 20 on the substrate 10 can be selected based on the size of the crystal desired, the number of crystals desired, or a balancing of these two factors. Specifically, for larger crystals, larger islands 20 are preferred (resulting in a lower island density on the substrate and a lower average throughput) and for higher throughputs, smaller islands 20 are preferred (resulting in a higher island density on the substrate and smaller crystals). Further, the metallic islands 20 can exist in a gradient of sizes, which provides for testing or screening an array of conditions. Those of ordinary skill in the art can produce islands 20 of a desired size without undue experimentation.

The silicon wafer or glass substrate 10 first can be rendered slippery or hydrophobic (lyophobic) by spincoating TEFLON® resins or the equivalent onto the substrate 10 or by immersing the substrate 10 in a silane surfactant solution. The metallic islands 20 can be fabricated on the lyophobic surface using a mesh 14 or by conventional lithography. The hydrophobic region allows the solution to be pinned to each respective island 20 and prevents the solution from spreading to its neighboring island 20. In a contrasting embodiment of a bifunctional substrate, when the surfactant first material 22 and the second surfactant material have been applied to the substrate 10, an alternating pattern of material can be formed. Specifically, the metallic islands 20 have a monolayer of the first surfactant material 22 and the backfill 30 has a monolayer of the second surfactant material. As will be seen, the crystals then will be prepared on the metallic islands 20 from solution droplets.

(2) Preparing a Crystal from Solution Droplets

A crystal 60 is prepared on at least one of the metallic islands 20 from solution droplets under a set of defined parameters. Crystallization parameters including temperature, solvent or mixture of solvents used, and concentration can also be examined with the substrate as the combination of these factors can lead to the appearance of new phases. Due to the large complexity of the molecule, proteins are extremely difficult to crystallize and are sensitive to the crystallization conditions which include the environment, temperature, pH, buffer and ionic strength. As the parameters influence the size and form of crystal formation, it is possible to determine the particular conditions for growing a crystal 60 of a desired size and form by testing various parameters.

Specifically, the multifunctional substrate 10 provides a background in which a droplet of droplet solution may be tested for its ability to crystallize. Solution droplets of various concentrations can be deposited on the metallic islands 20 for crystallization under desired conditions, which may be varied for high-throughput testing. The patterned metallic islands 20 provide a quick, reliable, consistent method to provide picoliter volumes or smaller solution droplets for the generation of supersaturated solutions resulting in the patterned crystallization of the solute with controlled size. Preferably, crystallization of organic and inorganic particles is constrained to the metallic island 20 for ordered crystallization. The solution can achieve supersaturation (low, modest or high, depending on the specific circumstances) via known techniques, such as, for illustrative purpose only, evaporation, vapor diffusion, antisolvent diffusion oil diffusion, and heating and cooling techniques. One method disclosed above for depositing solution droplets upon the metallic islands 20 is by immersion of the substrate into a crystallite solution. This method is preferred for the formation of similar composition crystals 60 on all of the islands 20 on the substrate 10, even if the metallic islands 20 have different sizes and/or different SAMs functionalities. In one embodiment, the immersion and slow withdrawal of the substrate 10 in a solution (containing the solute and solvent) produces the formation of array of droplets on the lyophilic (or hydrophilic) areas. Alternatively, the solution droplets may be deposited on the metallic islands 20 by a pipette. This method is preferred for the formation of different composition crystals 60 on individual islands 20 on the substrate 10.

As the SAMs on the metallic islands 20 preferentially bind the crystallite solution, droplets of the crystallite solution are formed on the metallic islands 20 of the substrate 10 by immersing and soaking the substrate 10 in the crystallite solution. Subsequently, the substrate 10 is slowly withdrawn from the solution such that the solution droplets bind to the metallic islands 20. The solution drops with defined size and shapes are formed on the metallic islands 20 when the patterned surface of the substrate 10 is immersed and slowly withdrawn from the solution. The droplets formed on the metallic islands 20 will eventually crystallize.

While the crystal 60 size can in part controlled by the size of the droplet and the size of the metallic islands 20, the crystal 60 form may be controlled by varying the rate of evaporation or other supersaturation technique, the incubation temperature, the concentration of droplet solution, and in this multi-functional SAMs embodiment, the chemical functionality of the SAMs. One of ordinary skill in the art can select and test conditions for producing a crystal 60 of a desired form and size without undue experimentation by, for example, varying the size and shape of the islands 20, by varying the supersaturation technique, by varying the initial concentration of the crystallite solution, and by varying the composition of the SAMs. By modifying the characteristics of the droplet, it is possible to obtain a crystal 60 of a desired form and size.

Figure 8:
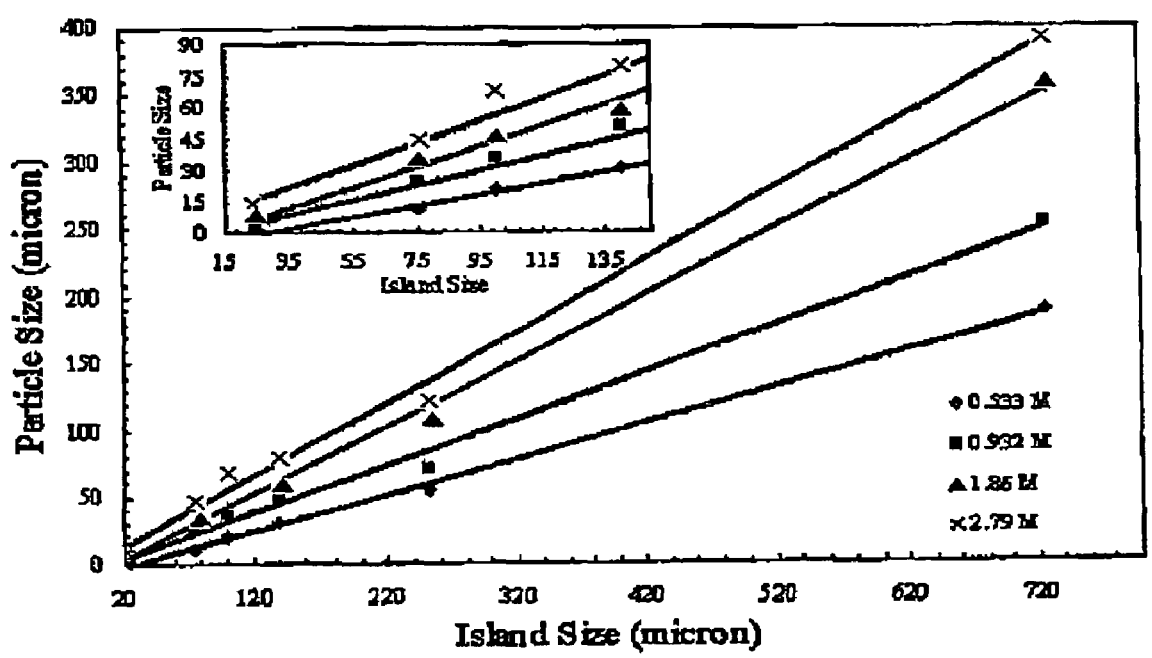
FIG. 8 is a graph showing the effect of island size and solution concentration on the crystal size of glycine.

FIG. 8 is a graph showing the effect of metallic island 20 size and solution concentration on the crystal 60 size of glycine crystals. As can be seen in FIG. 8, the metallic island 20 size has a direct correlation to the final crystal 60 size, with larger metallic islands 20 resulting in larger crystals 60. Further, as also can be seen in FIG. 8, the solution concentration also has a direct correlation to the final crystal 60 size, with solutions having greater concentrations of the crystallization material resulting in larger crystals 60. Thus, by manipulating the metallic island 20 size and/or the solution concentration, larger or smaller crystals 60 can be produced on the metallic islands 20.

Preferably, the droplet solution contains both seeds (crystallized material) and solvent. The seeds can provide a starting point for nucleation of the crystal 60 and the solvent is for providing additional material for the crystal 60 to grow. As the solution droplet contains seeds, the droplet need not undergo spontaneous crystallization, which in many instances can be rate limiting. As such, the time needed for crystallization is shorter.

Once a crystal 60 has formed on the metallic island 20, chemical, mechanical, and physical techniques (such as for example sonication and vibration) are suitable for removing the crystal 60 from the metallic island 20. In one embodiment, the crystal 60 may be detached from the metallic island 60 by sonicating the crystallized substrate in an anti-solvent. Also the crystals 60 may be removed in dry powder form by placing a sonic probe on the back of the substrate 10 and vibrating the surface rigorously to release the crystals 60. One of ordinary skill in the art may remove the crystals 60 from the substrate 10 using these and other conventional techniques.

(3) Screening the Crystals

The crystals 60 may be analyzed with or without the removal of the crystals 60 from the substrate 10. The size, morphology, and crystal form may be identified or analyzed by optical, electron, and Raman microscopy. Other analytic techniques such as single crystal and powder x-ray diffraction, particle analyzers, and thermal analysis may be used to identify the crystalline forms on the metallic islands 20 as well. For example, once the crystals 60 are formed, the crystals 60 can be characterized or otherwise screened by known techniques, such as Raman microscopy, without removing the crystals 60 from the metallic islands 20. By providing for the nucleation and growth of the crystals 60 and the screening of the crystals 60, all on the metallic islands 20, the present invention is a highly efficient method of screening crystals 60 using the small distinct metallic islands 20 without having to handle the crystals 60 any more than is necessary or desired.

In terms of polymorph screening, the bulk solution from which the solution droplets emanate may contain various forms of a crystal, such as a stable α-polymorph and a metastable β-polymorph. Metastable forms have a tendency to change quickly to the more stable form. In the present invention, the crystals 60 are grown on a solid, namely, the distinct metallic islands 20. As a result, crystals 60 of the metastable polymorph can grow on the distinct metallic islands 20, resulting in the production of more and better metastable (or other) polymorphs. The growth of the crystals 60 on the solid metallic islands 20 helps to prevent the conversion of the metastable crystals to the more stable crystals as solid state conversion is less likely to occur than liquid state conversion.

High throughput screening methods are known and are suitable for use in the present invention. For example, the use of a rectangular array of individual samples to be screened in combination with mechanisms for manipulating the rectangular array are well known. A first illustrative screening method is for the rectangular array to remain motionless and for a screening device to be moved so as to impinge sequentially upon each distinct metallic island 20. A second illustrative screening method is for the screening device to remain motionless and for the rectangular array to be moved such that the screening device sequentially impinges upon each distinct metallic island 20. Other such high throughput screening methods are known and are suitable for the present invention, including, for example, screening methods that are non-sequential or screen more than one sample at once.

These methods can be carried out under a variety of conditions, enabling one to explore the polymorph landscape and nucleation domain. Moreover, the substrate 10 can be coupled with high throughput methodologies for analytical characterization. For example, FIG. 9 shows a scheme for analyzing and identifying the size and shape of the crystals 60 with both optical microscopy and Raman microscopy, which can be utilized to evaluate the solid forms by comparison with the known polymorphs of the chemical.

More specifically, each array of metallic islands 20 can be handled as a discrete screening entity without having to remove the individual crystals 60 from the individual metallic islands 20. The substrate 10 with the array of metallic islands 20 can be mounted on a device for screening by, for example, a Raman or optical (or combination) microscopy device 100. In this manner, the microscopy device 100 can be programmed to examine the crystals 60 on each metallic island 20 in the same known manners that such a microscopy device 100 can be programmed to examine a sequential array of hanging drops, a sequential array of vessels such as cuvettes, pipettes or test tubes, or a micro-well array of individual micro-wells.

Figure 9:
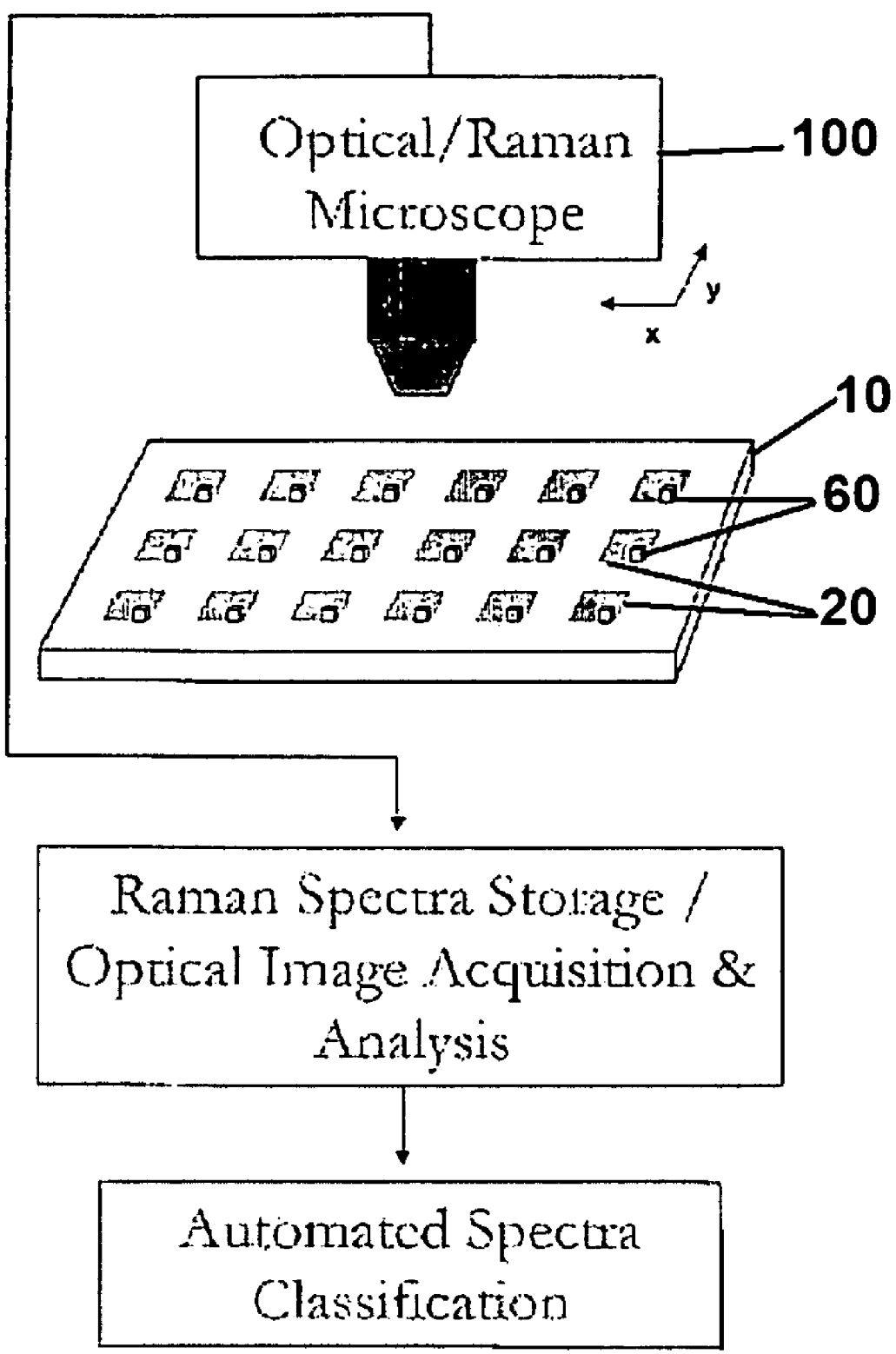
FIG. 9 is a schematic illustration and flow chart of a high throughput analytical method for screening crystals.

As shown in FIG. 9, the microscopy device 100 examines the array of crystal 60 on the islands 20 on the substrate 10. This can be done in any of the known manners. Once a Raman spectra, or an optical image, or another spectra or image dependent on the type of microscopy used, is acquired, the spectra image then is analyzed. A basic form of analysis is to compare the spectra or image to a previously compiled database of spectra or images to determine the type of crystal 60. This can be accomplished using an automated spectra or image classification system, such as those known in the art.

EXAMPLES

1. Glycine Crystals.

Glycine was selected as an illustrative compound as it is the simplest amino acid and is known to provide a base for extrapolation to other amino acids, proteins and the like. For example, those of ordinary skill in the art recognize that the results of experimentation with glycine are applicable and can be extrapolated to other amino acids, proteins, and the like. Thus, if a method is successful with glycine, it is assumable that the method will be successful with other amino acids, proteins and the like.

Glycine was crystallized on a patterned bifunctional glass substrate (slide) with gold islands. The gold islands were prepared using various meshes with openings ranging from 25 microns to 725 microns. After the metallic islands were prepared, carboxyl-terminated SAMs were formed on the gold islands and methyl-terminated SAMs, octadecylrichlorosilane (OTS) were deposited to the area surrounding the gold islands.

Figure 10A:
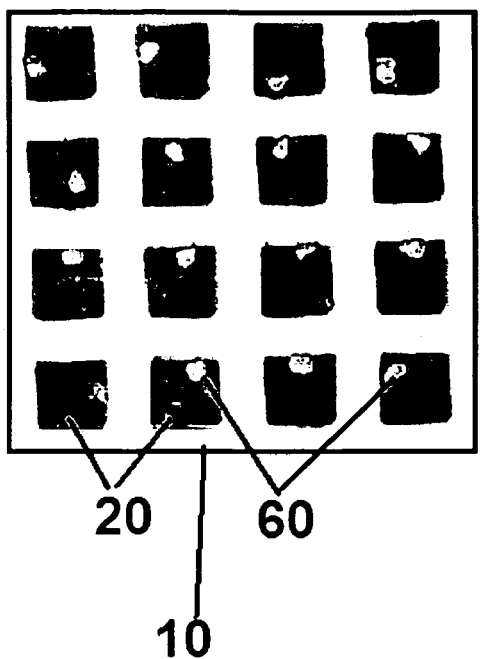
FIG. 10 are photomicrographs of glycine crystals grown on two different sizes of gold metallic islands, with FIG. 10A on 130 µm islands and FIG. 10B on 30 µm islands.
Figure 10B:
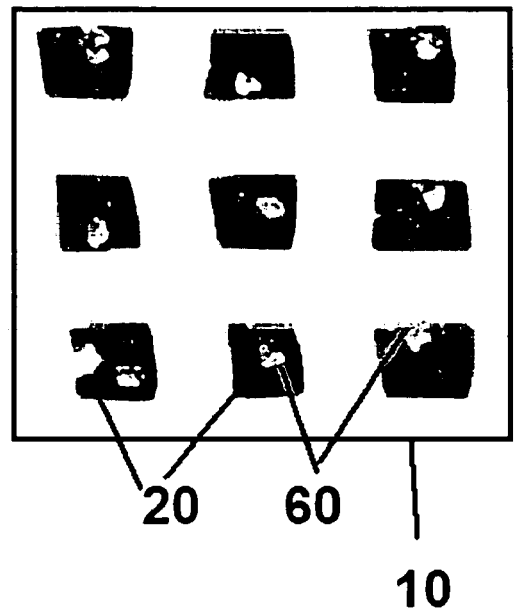

An undersaturated solution of glycine, prepared in a 6.5% w/w ratio of glycine to water (7 gm glycine per 100 gm water), was deposited upon the gold islands. The glycine solution was deposited on the slide by immersing the slide in the glycine solution so that droplets of solution were produced on the gold islands. As shown in FIG. 10, a uniform array of glycine crystals 60 nucleated and crystallized on the gold islands 20 after the solution droplets on the gold island 20 were evaporated at room temperature. FIG. 10A is a photomicrograph of single glycine crystals 60 on 130 μm gold islands 20. FIG. 10B is a photomicrograph of single glycine crystals 60 on 30 μm gold islands 20. The position of the crystals 60 was dependent on the direction and orientation of the substrate 10 when it is withdrawn from the solution. Further, the size of the crystal 60 was dependent on the size of the metallic islands 20, with the crystals 60 on the larger metallic islands 20 of FIG. 10A being larger than the crystals 60 on the smaller metallic islands 20 of FIG. 10B.

As shown in Table 1, the size of glycine crystals grown on various gold islands varies with metallic island size. Specifically, the data in Table 1 shows that the size and density of the glycine crystals were related to the size of the metallic islands. It is observed that with smaller island sizes, the unstable (or high energy) polymorph, β-glycine, is stabilized (or formed) on the islands. See also the inventors' recent papers on the crystallization of different glycine polymorphs and the control of glycine particle size on the metallic islands, Lee, A. Y., Lee, I. S., Dette, S. S., Boerner, J., and Myerson, A. S., Crystallization on Confined Engineered Surfaces: A Method to Control Crystal Size and Generate Different Polymorphs, Journal of the American Chemical Society, 2005, 127, 14982-3, and Lee, A. Y., Lee, I. S., and Myerson, A. S., Factors affecting the polymorphic outcome of glycine crystals constrained on patterned substrates, Chemical Engineering & Technology, 2006, 29(2), 281-285.

TABLE 1

| Test No. | Island Size (microns) | Number of Islands on Glass Slides (2 cm × 1 cm) | Crystal Size Range (microns) | Mass per Surface Area (mg/cm$^2$) |
|---|---|---|---|---|
| 1 | 725 | 200 | 200-290 | 13.64-31.23 |
| 2 | 130 | 5000 | 40-50 | 2.55-498 |
| 3 | 100 | 9800 | 20-30 | 0.54-1.82 |
| 4 | 75 | 16200 | 15-20 | 0.40-1.82 |
| 3 | 30 | 80000 | 5-10 | 0.093-.75 |

2. Mefenamic Acid (Form II) Crystals

A high dose of non-steroidal anti-inflammatory analgesic agent, mefenamic acid (form II), was crystallized on a patterned bifunctional glass substrate (slide) with gold islands. This difficult to crystallize drug was crystallized from undersaturated solutions of N,N-Dimethylformamide (DMF) (2.5 grams of mefenamic acid per 100 grams of DMF and 3.75 grams of mefenamic acid per 100 grams of DMF). Droplets of the solutions were placed by immersion on the gold islands, having a monolayer of carboxyl terminated SAMs with methyl-terminated (OTS) attached on the glass substrate. Specifically, solution droplets were formed after immersion and removal of the bi-functional surface from the respective solutions. Patterned crystallization occurred after the solvent was evaporated at room temperature.

Figure 11A:
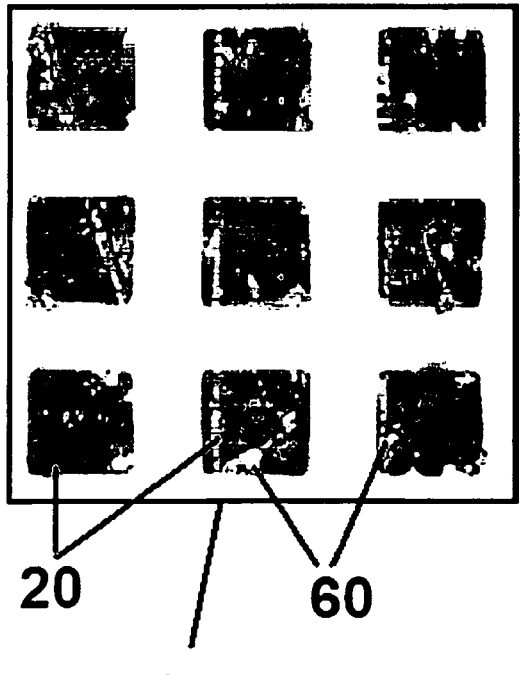
FIG. 11 are photomicrographs of mefenamic acid crystals grown on two different sizes of metallic islands, with FIG. 11A on 95 µm islands and FIG. 11B on 50 µm islands.
Figure 11B:
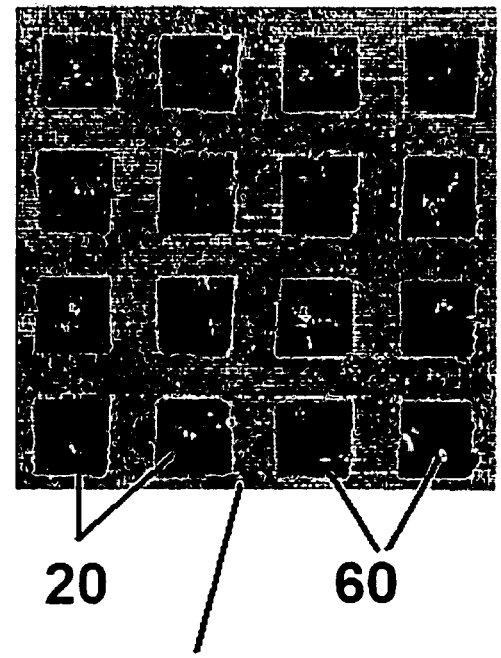

As shown in FIG. 11, mefenamic acid crystals 60 (in the range of 25 to 40 microns) were grown on the metallic islands 20. FIG. 11A is a photomicrograph of mefenamic acid crystals 60 (35 μm) formed on 130 μm gold islands 20. FIG. 11B is a photomicrograph of mefenamic acid crystals 60 formed on 50 μm gold islands 20. The crystal forms were analyzed using Raman microscopy and the analysis revealed that the crystalline form was the metastable modification (Form II), which is expected form when grown from DMF solution as reported previously.

Figure 12:
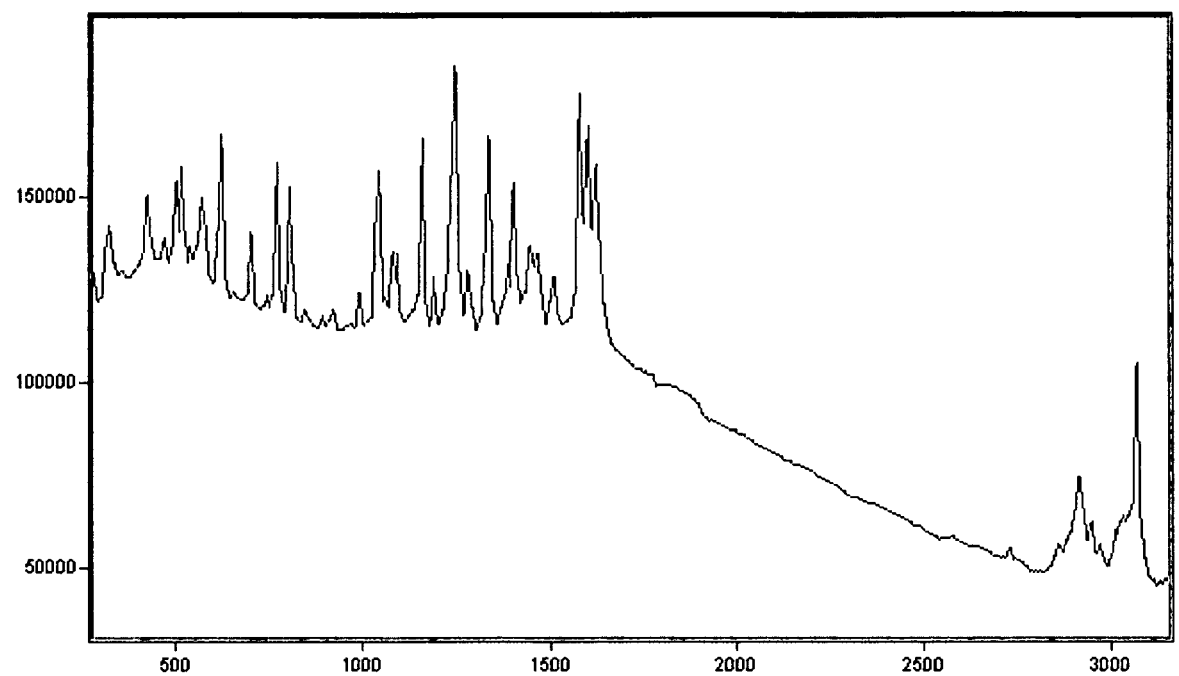
FIG. 12 is a representative Raman Spectra of β-glycine.
Figure 13:
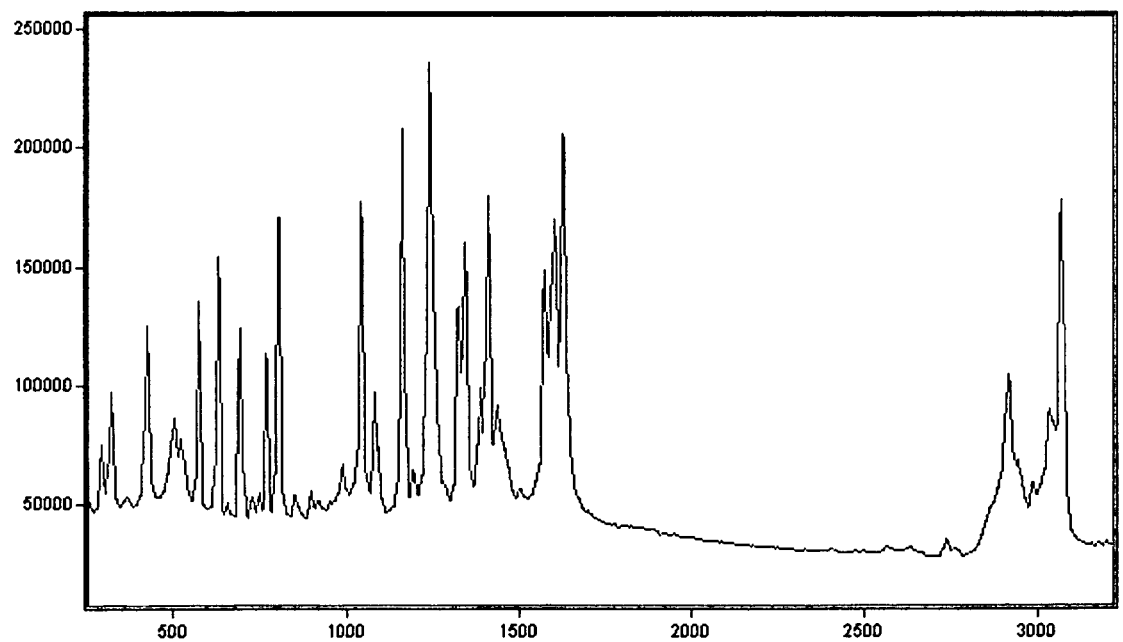
FIG. 13 is a representative Raman Spectra of α-glycine.

Table 2 shows a polymorph distribution in percentages of mefenamic acid crystals on different island sizes. Mefenamic acid was crystallized from DMSO. Unlike glycine, mefenamic acid has two anhydrous (or neat) polymorphs, Form I and Form II. With diminishing island sizes, the unstable phase, Form II, is favored as evident in the solution concentrations of 0.621M and 0.829M. The polymorphs were identified by Raman microscopy and compared to references Raman spectra where each form was generated through experimental procedures reported in the literature. FIGS. 12 and 13 are the reference Raman spectra for each form, with FIG. 12 being the reference Raman spectra for mefenamic acid Form I and FIG. 13 being the reference Raman spectra for mefenamic acid Form II.

TABLE 2

| Island Size (micron) | Concentration | | | | | | | |
|---|---|---|---|---|---|---|---|---|
| | 0.207M | | 0.414M | | 0.621M | | 0.829M | |
| | Form I | Form II | Form I | Form II | Form I | Form II | Form I | Form II |
| 725 | 0 | 100 | 0 | 100 | 11 | 89 | 20 | 80 |
| 250 | 0 | 100 | 0 | 100 | 5 | 95 | 16 | 84 |
| 140 | 0 | 100 | 0 | 100 | 0 | 100 | 5 | 95 |
| 25 | — | — | — | — | — | — | 1 | 99 |

Note:
Form II is the unstable form and Form I is the stable polymorph at room temperature.

3. Polymorphs of Glycine Crystals

A reduction in the evaporation rate of the droplet solution promoted one crystal form over another. A bifunctional substrate was prepared following the procedure of described in Example 1 and solution droplets were prepared that had a reduced rate of evaporation. Specifically, the addition of glycerol to the solution (7 grams of glycine per 95 grams of water and 5 grams of glycerol) reduces the evaporation rate as the solution is more viscous and less readily to evaporate if compared to an aqueous solution. The bifunctional substrate was immersed in the droplet solution and withdrawn from the solution so that droplets formed on the metallic islands. Crystallization occurred on the metallic islands after evaporation at room temperature and the crystal was analyzed using Raman spectroscopy.

Figure 14:
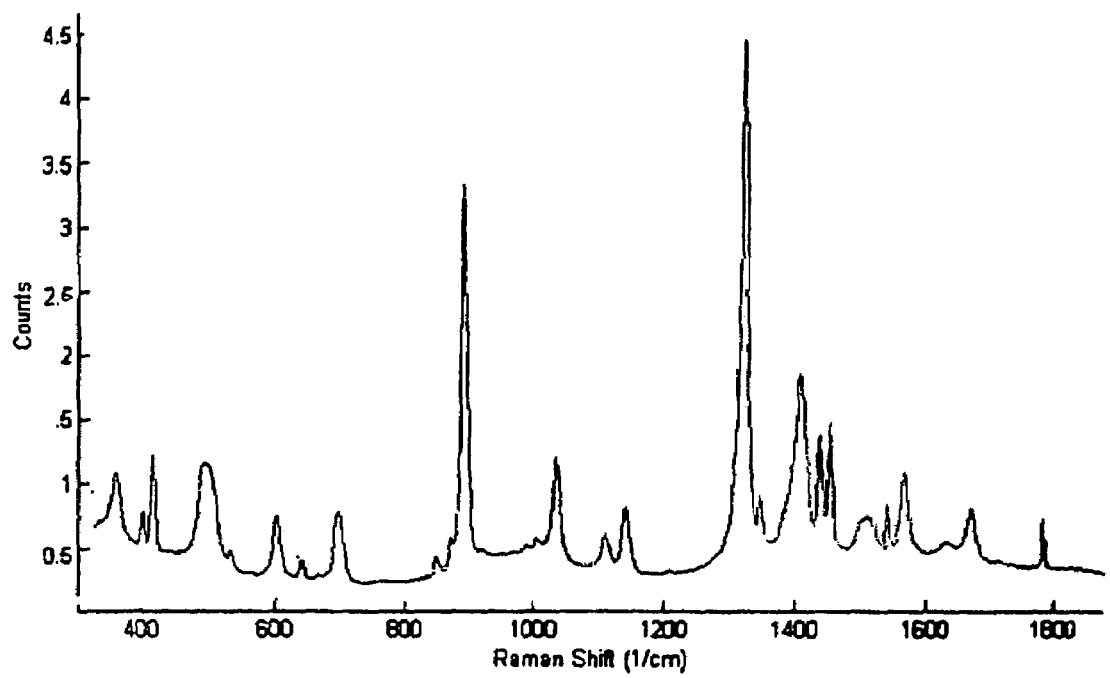
FIG. 14 is a representative Raman Spectra of mefenamic acid Form I.
Figure 15:
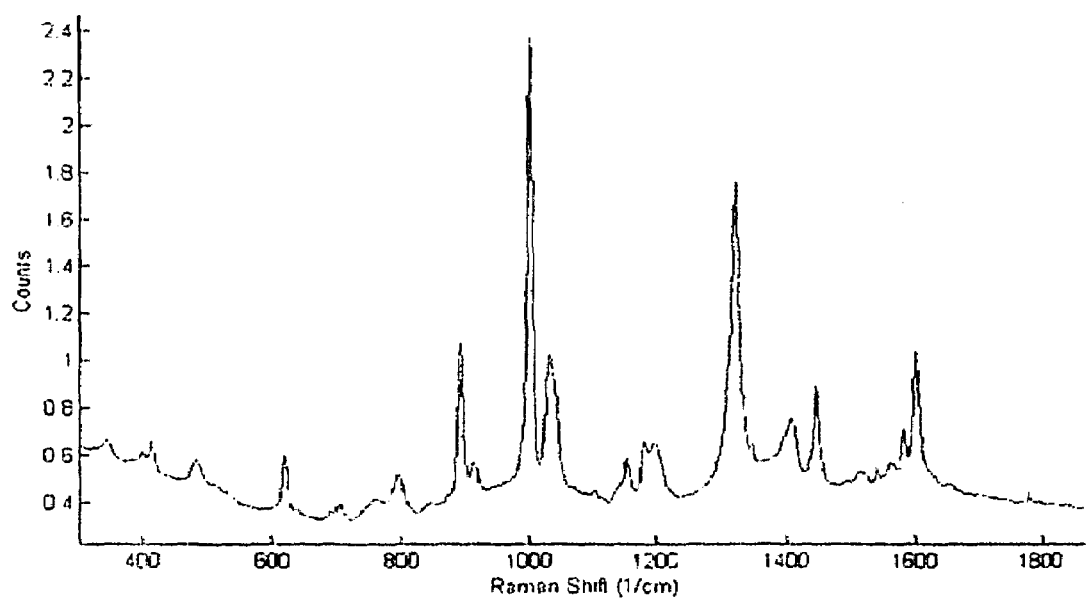
FIG. 15 is a representative Raman Spectra of mefenamic acid Form II.

Raman spectroscopy, which uses characteristics of the vibrational mode of chemical compounds in the crystal lattice and can be used to determine and identify polymorphs, showed the glycine crystal grown had an unstable β-form polymorph. As shown in FIG. 14, Raman spectroscopy showed that the glycine crystals grown from the droplet solution with a fast evaporation rate of Example 1 were of the β-form that is crystallized typically in ethanol and water mixtures (see Iitaka, Y. Acta Crystallographica, 13, 35-45, 1960) or saturated aqueous solution of glycine containing acetic acid (see Drebushchak, T. N., Boldyreva and E. V., Shutova, E. S., ACTA Crystallographica E58, 0634-0636, 2002). This β-form glycine crystal was a different form from the α-form that crystallized under the reduced rate of evaporation conditions and has the Raman spectra shown in FIG. 15.

4. Polymorphs of Sulfathiazole

Sulfathiazole has five neat (or anhydrous) polymorphs. Using the procedures disclosed herein, sulfathiazole crystals were formed on metallic islands. On a couple of the islands, four different polymorphs of sulfathiazole were crystallized concomitantly. As can be seen in Table 3, in which the polymorphs have been labeled or designated by the CCDC (Cambridge Crystallographic Date Centre) Reference Codes, the polymorph stability increases from left to right with SUTHAZ04, the most stable phase at room temperature and SUTHAZ01, the least stable. Table 3 shows the polymorph distribution in percentages of sulfathiazole crystals on different island sizes at a fixed concentration

TABLE 3

| Island Size (micron) | SUTHAZ01 | SUTHAZ | SUTHAZ02 | SUTHAZ04 |
|---|---|---|---|---|
| 725 | 0 | 4 | 10 | 86 |
| 250 | 12 | 9 | 12 | 66 |
| 140 | 42 | 14 | 16 | 29 |

As can be seen from the foregoing disclosure and examples, the present invention presents a multi-fold method for producing crystals of interest. First, crystals of selected size can be produced by varying the solution concentration and/or the metallic island size. Second, metastable polymorphs, or polymorphs of lower stability that known or common polymorphs, can be produced due to the solid state nature of the crystallization process occurring on the metallic islands. Third, the sheer number and variety of crystals that can be produced using an array of metallic islands on a substrate is greater, resulting in a more efficient and useful crystal condition screening method. Fourth, the combination of two or more of the preceding three factors provides an enhanced method for producing crystals of interest and uniformity for further research.

The foregoing detailed description of the preferred embodiments and the appended figures have been presented only for illustrative and descriptive purposes. They are not intended to be exhaustive and are not intended to limit the scope and spirit of the invention. The embodiments were selected and described to best explain the principles of the invention and its practical applications. One skilled in the art will recognize that many variations can be made to the invention disclosed in this specification without departing from the scope and spirit of the invention.

What is claimed is:

1. A method for the screening of crystallization conditions comprising the steps of:
   a) forming a plurality of metallic islands on a substrate, wherein the metallic islands vary in size;
   b) applying a first self-assembled monolayers comprising a first functional group to at least one of the metallic islands to form a first type of functionalized metallic island, and applying a second self-assembled monolayers comprising a second functional group different from the first functional group to at least another of the metallic islands to form a second type of functionalized metallic island;
   c) nucleating and growing crystals of a selected substance on the functionalized metallic islands; and
   d) after the crystals have formed on the functionalized metallic islands, analyzing the crystals.

2. The method as claimed in claim 1, wherein the functional groups of the self-assembled monolayers are selected to create a preferential bond between the metallic islands and solution droplets comprising the selected substance.

3. The method as claimed in claim 1, wherein a solution droplet comprising a crystallite solution for nucleating and growing the crystal is deposited on the functionalized metallic islands for nucleating and growing the crystals of the selected substance on the functionalized metallic islands.

4. The method as claimed in claim 3, wherein the solution droplet becomes a more saturated solution by removing solvent by a method selected from the group consisting of evaporation, antisolvent addition, vapor diffusion, oil diffusion, heating and cooling, or combination thereof.

5. The method as claimed in claim 1, wherein a metal layer is deposited onto the substrate to form the metallic islands using a metal evaporation process.

6. The method as claimed in claim 5 wherein the metal suitable for use as the metal layer is selected from the group consisting of gold, silver titanium, platinum, nickel, copper, palladium, and combinations thereof.

7. The method as claimed in claim 6, wherein a metal adlayer is first deposited onto the substrate to promote adhesion between the metal layer and the substrate.

8. The method as claimed in claim 7, wherein the metal adlayer is selected from the group consisting of titanium and chromium, which are deposited onto the substrate using an electron beam evaporator.

9. The method as claimed in claim 1, wherein the conditions for crystallization are selected to promote a specific form or size of crystal.

10. A method for the screening of crystallization conditions comprising the steps of:
    a) forming a plurality of metallic islands on a substrate, wherein there are at least two different sizes of metallic islands on the substrate;
    b) applying a first self-assembled monolayers comprising a first functional group to at least one of the metallic islands to form a first type of functionalized metallic island, and applying a second self-assembled monolayers comprising a second functional group different from the first functional group to at least another of the metallic islands to form a second type of functionalized metallic island;
    c) nucleating and growing crystals of at least one selected substance on the functionalized metallic islands; and
    d) after the crystals have formed on the functionalized metallic islands, analyzing the crystals.

11. The method as claimed in claim 10, wherein solution droplets comprising crystallite solutions for nucleating and growing the crystals of the at least one selected substance are deposited on the functionalized metallic islands for nucleating and growing the crystals of the at least one selected substance on the functionalized metallic islands.

12. The method as claimed in claim 11, wherein the solution droplet becomes a more saturated solution by removing solvent by a method selected from the group consisting of evaporation, antisolvent addition, vapor diffusion, oil diffusion, heating and cooling, or combination thereof.

13. The method as claimed in claim 12, wherein the functional groups of the self-assembled monolayers are selected to create a preferential bond between the metallic islands and the solution droplets.

14. The method as claimed in claim 13, wherein a metal layer is deposited onto the substrate to form the metallic islands using a metal evaporation process.

15. The method as claimed in claim 14 wherein the metal suitable for use as the metal layer is selected from the group consisting of gold, silver titanium, platinum, nickel, copper, palladium, and combinations thereof.

16. The method as claimed in claim 15, wherein a metal adlayer is first deposited onto the substrate to promote adhesion between the metal layer and the substrate.

17. The method as claimed in claim 16, wherein the metal adlayer is selected from the group consisting of titanium and chromium, which are deposited onto the substrate using an electron beam evaporator.

18. The method as claimed in claim 10, wherein conditions for crystallization are selected to promote a specific form or size of the crystal.

19. A method for the screening of crystallization conditions comprising the steps of:
    a) depositing a metal adlayer onto a substrate;
    b) forming a plurality of metallic islands on the metal adlayer on the substrate;
    c) applying at least two different self-assembled monolayers comprising different functional groups to the metallic islands to form functionalized metallic islands;
    d) nucleating and growing crystals of a selected substance on functionalized metallic islands; and
    e) after the crystals have formed on the functionalized metallic islands, analyzing the crystals.

20. The method as claimed in claim 19, wherein solution droplets comprising crystallite solutions for nucleating and growing the crystals of the at least one selected substance are deposited on the functionalized metallic islands for nucleating and growing the crystals of the at least one selected substance on the functionalized metallic islands.

21. The method as claimed in claim 20, wherein the solution droplets become a more saturated solution by removing solvent by a method selected from the group consisting of evaporation, antisolvent addition, vapor diffusion, oil diffusion, heating and cooling, or combination thereof.

22. The method as claimed in claim 21, wherein the functional groups are selected to create a preferential bond between the metallic islands and the solution droplets.

23. The method as claimed in claim 22, wherein a metal layer is deposited onto the substrate to form the metallic islands using a metal evaporation process.

24. The method as claimed in claim 23 wherein the metal suitable for use as the metal layer is selected from the group consisting of gold, silver titanium, platinum, nickel, copper, palladium, and combinations thereof.

25. The method as claimed in claim 22, wherein at least two of the metallic islands are different sizes.

26. The method as claimed in claim 20, wherein conditions for crystallization are selected to promote a specific form or size of the crystal.

27. The method as claimed in claim 19, wherein the metal adlayer is selected from the group consisting of titanium and chromium, which are deposited onto the substrate using an electron beam evaporator.

* * * * *

UNITED STATES PATENT AND TRADEMARK OFFICE
CERTIFICATE OF CORRECTION

| | |
|---|---|
| PATENT NO. | : 7,329,592 B2 |
| APPLICATION NO. | : 11/368006 |
| DATED | : February 12, 2008 |
| INVENTOR(S) | : Allan S. Myerson and Alfred Y. Lee |

It is certified that error appears in the above-identified patent and that said Letters Patent is hereby corrected as shown below:

In the Specifications:

At column 1, line 12, between the STATEMENT OF RELATED APPLICATIONS section and the BACKGROUND OF THE INVENTION section, insert as a separate section:

--STATEMENT OF GOVERNMENT INTEREST

This invention was made with Government support under contract number N00173-06-1-G007 that was awarded by the Naval Research Laboratory. The Government has certain rights in the invention.--

Signed and Sealed this
Seventh Day of May, 2013

Teresa Stanek Rea
*Acting Director of the United States Patent and Trademark Office*